United States Patent
Ludwig

(10) Patent No.: US 7,391,120 B2
(45) Date of Patent: Jun. 24, 2008

(54) INCREASING THE ADHESION OF AN ADHESIVE CONNECTION IN HOUSINGS

(75) Inventor: Ronny Ludwig, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 260 days.

(21) Appl. No.: 11/246,747

(22) Filed: Oct. 6, 2005

(65) Prior Publication Data

US 2006/0071348 A1   Apr. 6, 2006

(30) Foreign Application Priority Data

Oct. 6, 2004   (DE) .................. 10 2004 048 608

(51) Int. Cl.
*H01L 23/48* (2006.01)
(52) U.S. Cl. .................. 257/783; 257/678; 257/739; 257/773; 257/776; 257/782; 257/E23.02; 257/E23.037; 257/E23.04

(58) Field of Classification Search ......... 257/666–677, 257/E23.001–E23.194
See application file for complete search history.

(56) References Cited

U.S. PATENT DOCUMENTS

| | | | |
|---|---|---|---|
| 6,224,711 B1 * | 5/2001 | Carden et al. ............... | 156/311 |
| 6,707,152 B1 * | 3/2004 | Schrock ..................... | 257/738 |
| 6,831,372 B2 * | 12/2004 | Ruhland ..................... | 257/783 |
| 6,838,758 B1 * | 1/2005 | Montiel ..................... | 257/678 |

* cited by examiner

*Primary Examiner*—Jasmine J Clark
(74) *Attorney, Agent, or Firm*—Kenyon & Kenyon LLP

(57) ABSTRACT

A housing having a non-detachable bond to a micromechanical component using a flexible bonding material in particular. The combination including the housing and the micromechanical component as well as the manufacturing method of this combination. At least part of the component and/or of the housing has depressions for receiving the bonding material. These depressions may be designed as grooves, for example.

12 Claims, 3 Drawing Sheets

INCREASING THE ADHESION OF AN ADHESIVE CONNECTION IN HOUSINGS

FIELD OF THE INVENTION

The present invention is directed to a housing and a micromechanical component bonded to this housing, and to a method for manufacturing a housing and a micromechanical component bonded to this housing.

BACKGROUND INFORMATION

Conventional premolded housings have unstructured and smooth housing bottoms. To install stress-sensitive (micromechanical) sensor chips in such a housing, isolating it from all possible types of stress, soft adhesives, for example silicone adhesives, are often used. However, such adhesives have the disadvantage under certain conditions that they have insufficient adhesion to the currently used premolded housing materials, such as LCP. Thus, at high temperatures, for example, the sensor chip may become detached from the housing bottom, resulting in damage to the sensor chip or in incorrect measurements.

German Patent Application No. DE 198 29 248 describes extrusion of a plastic body onto a printed circuit sheet whose printed circuits have a "cauliflower" structure having depressions and projections. The extrusion produces, together with the increasing cross section of the printed circuits, a form-fitting rigid bond between the plastic body and the printed circuit sheet.

Another possibility of securing a sensor chip in a premolded housing is to cover the sensor chip fully or partially with a (passivating) gel as shown, for example, in German Patent Application No. DE 102 004 015 123.

SUMMARY OF THE INVENTION

The present invention is directed to a housing having a non-detachable bond to a micromechanical component using a flexible bonding material in particular. In addition to the combination including the housing and the micromechanical component, the manufacturing method of this combination is also provided by the present invention. A core of the present invention is that at least part of the component and/or of the housing has depressions for receiving the bonding material.

These depressions may be designed as grooves, for example. The depressions are advantageously provided on the component whose adhesion to the adhesive used is weaker.

By using a plurality of depressions into which the bonding material is placed, the contact surface of the bonding material may be advantageously increased in such a way that increased adhesion between the housing and component, for example a sensor element, is achieved. Furthermore, a certain degree of form-fitting to the housing bottom may be achieved, which may also reinforce the adhesion.

Alternatively, the depressions may be located on the inner bottom of the housing, but also on the bottom of the micromechanical component. To make the adhesion uniformly effective laterally in all directions of the housing, the depressions, i.e., the groove structure, may be given a symmetric design.

An embodiment of the present invention in which the non-detachable bond between the housing and the micromechanical component has a high degree of thermomechanical stress compensation is particularly advantageous. This may be achieved, for example, in that the flexible bonding material compensates the thermal expansion of the housing and/or of the component to the greatest possible extent, so that this expansion is not, or is only minimally, transferred to the mating piece. Thermomechanical effects on the measuring signal of a sensor element including the component may thus be avoided or considerably reduced.

In a refinement of the present invention, the bonding material has an adhesive, for example, a silicone adhesive.

Instead of providing the housing or component with depressions on one side, the depressions may also be applied on both parts, and the depressions of the component and of the housing may be designed in such a way that they engage with one another. Thus, for example, the depressions on the bottom of the component may "snap" into the depressions on the inner bottom of the housing, whereby the adhesion increases further, in addition to the effect of the bonding material.

It is furthermore advantageous that the depressions in the housing may also be structured later, after manufacturing, for example, by embossing into the plastic bottom in LCP premolded housings.

All in all, chip delamination caused by stress may be prevented or reduced by the method according to the present invention and the design of the depressions according to the present invention.

DETAILED DESCRIPTION

The use of depressions, i.e., grooves, on the inner bottom of the housing or on the bottom of a sensor chip increases the adhesion of a housing/chip unit. Thus, the adhesive contact surface between the housing material and the adhesive surface of the chip is enlarged by the many small depressions, creating a more stable bond. In addition, a certain degree of form-fitting may be achieved, which further increases adhesion. Symmetric groove structures may conduct the adhesive effect uniformly in all lateral directions of the housing.

Figure 1:
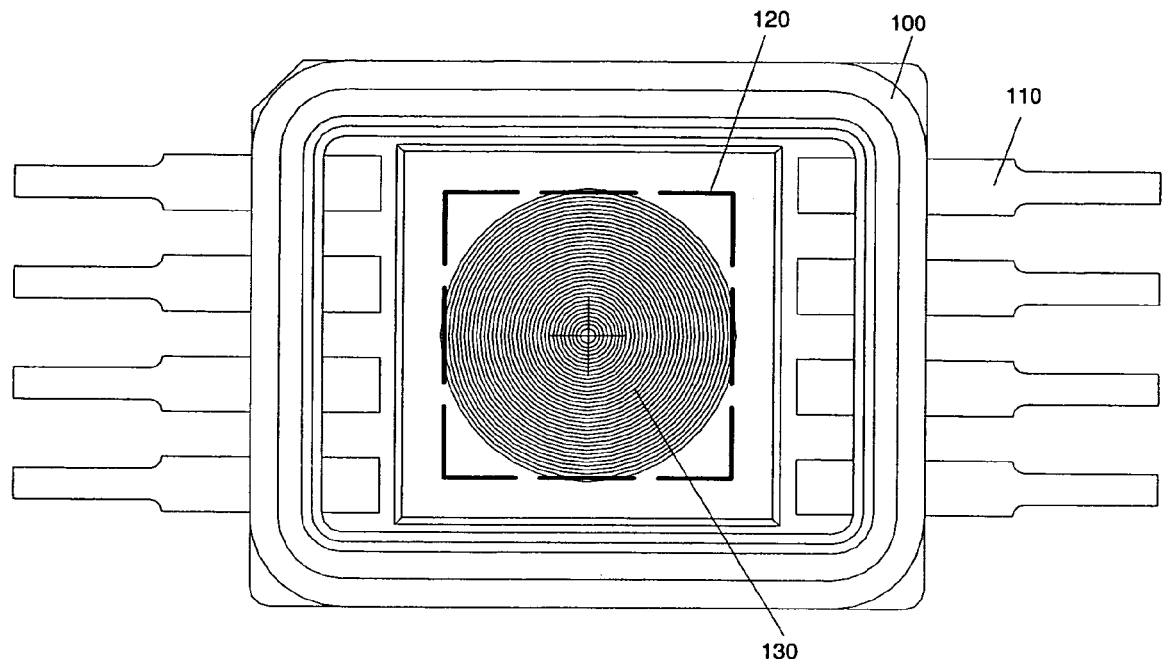
FIGS. 1, 3, 4, and 5 show examples of the provision of depressions according to the present invention on the inner bottom of a housing; these depicted structures may also be similarly provided on the bottom of a component.

FIG. 1 shows a possible exemplary embodiment of the present invention. It shows a top view of premolded housing 100 made of a suitable plastic or epoxide, provided with four leads 110 of a lead frame on each side. A chip adhesive surface 120 having a groove-type bottom structure 130 is provided within housing 100. As shown in FIG. 1, this bottom structure may have a round design and have a depression depth of 50μ.

Figure 2A:
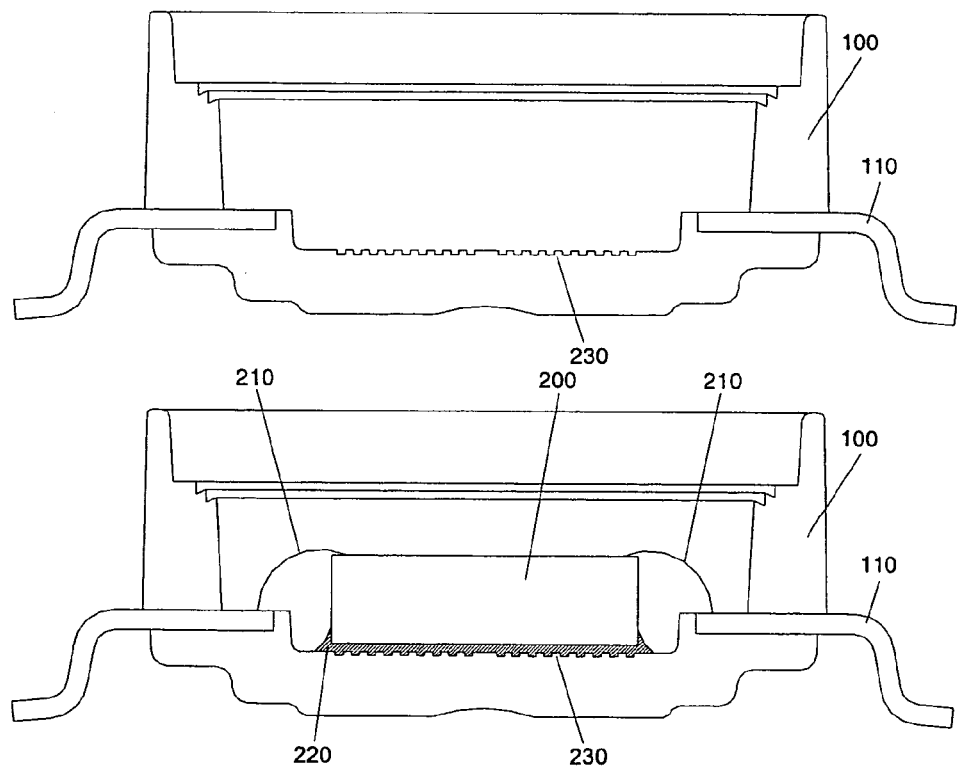
FIGS. 2a and 2b show two possibilities for using depressions in the housing or in the component.
Figure 2B:
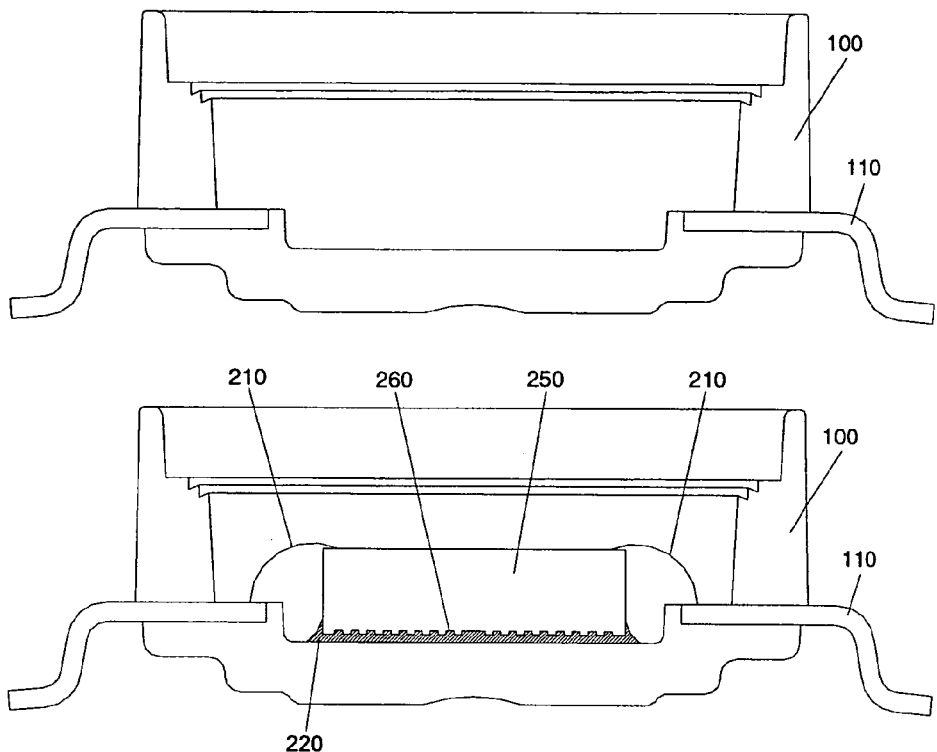

FIG. 2a shows a corresponding side view of housing 100 having a micromechanical component 200, for example, a sensor element. Curved leads 110 protruding from housing 100 are visible on the side. Component 200, i.e., the sensor element, may be electrically connected to leads 110 directly or indirectly using suitable bond connections 210. Depressions 230 including bonding material 220, which is introduced between component 200 and the housing bottom, are clearly visible in FIG. 2a. In contrast to the embodiment according to FIG. 2a, the embodiment of FIG. 2b provides the bottom of component 250 with depressions 260 which are capable of accommodating bonding material 220. All in all, this "toothing" represents a certain degree of form-fitting, which may result in a further increase in the adhesive effect in addition to the adhesion due to the bonding material and the enlarged adhesive surface.

Due to the use of a suitable bonding material 220, thermal expansion of housing 100 has little or no effect on component 200 or 250. Thermomechanical effects on the measuring signal of a sensor element may thus be largely avoided due to a compensation effect of the bonding material.

Figure 3:
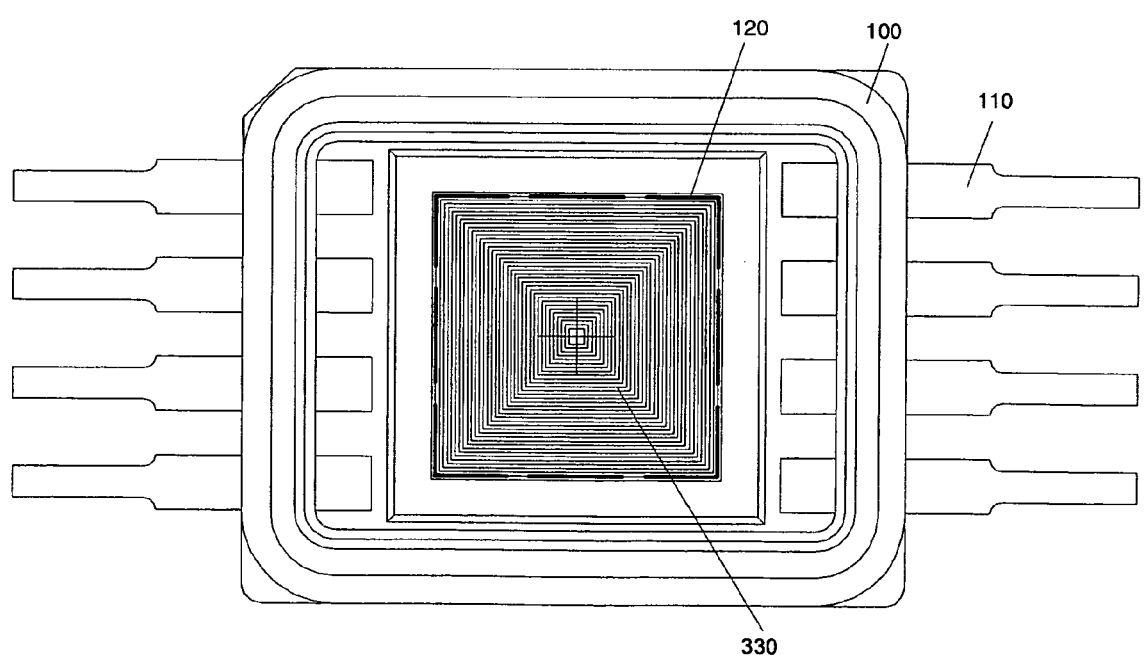
Figure 4:
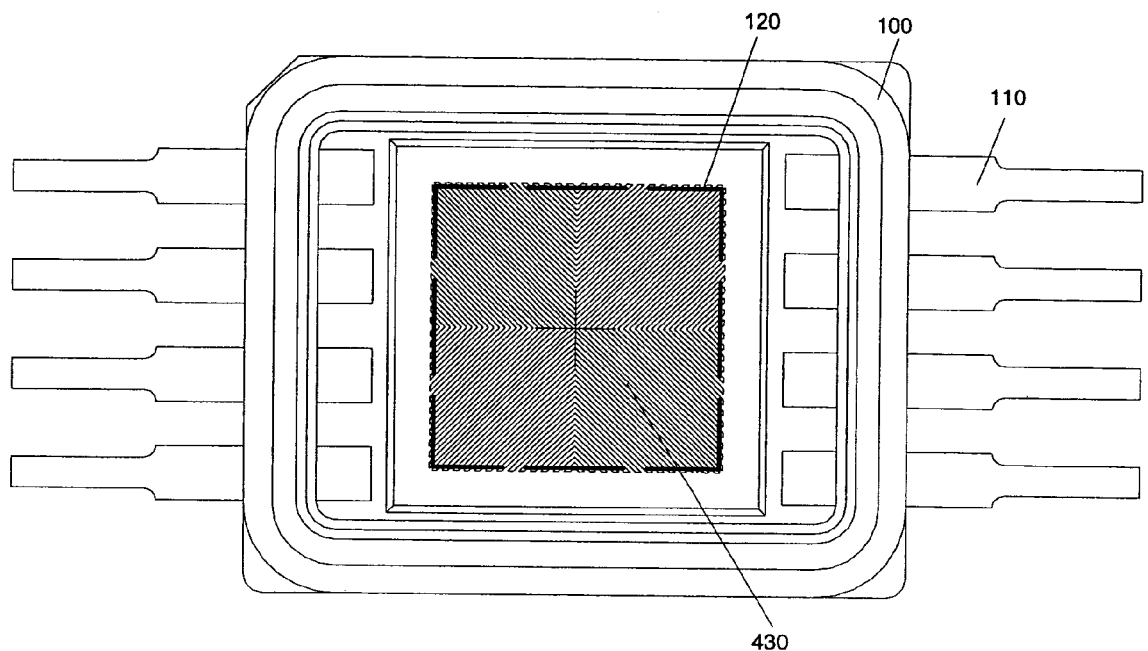

FIG. 3 shows another embodiment in which housing 100 on chip adhesive surface 120 has a rectangular or square groove configuration 330 as the bottom structure. In contrast, the bottom structure in FIG. 4 has a cross-shaped groove configuration 430. In the case of a groove configuration of this type, the excess bonding material may be pushed out to the side in such a way that the component, i.e., the (sensor) chip, may be applied evenly to adhesive surface 120.

Figure 5:
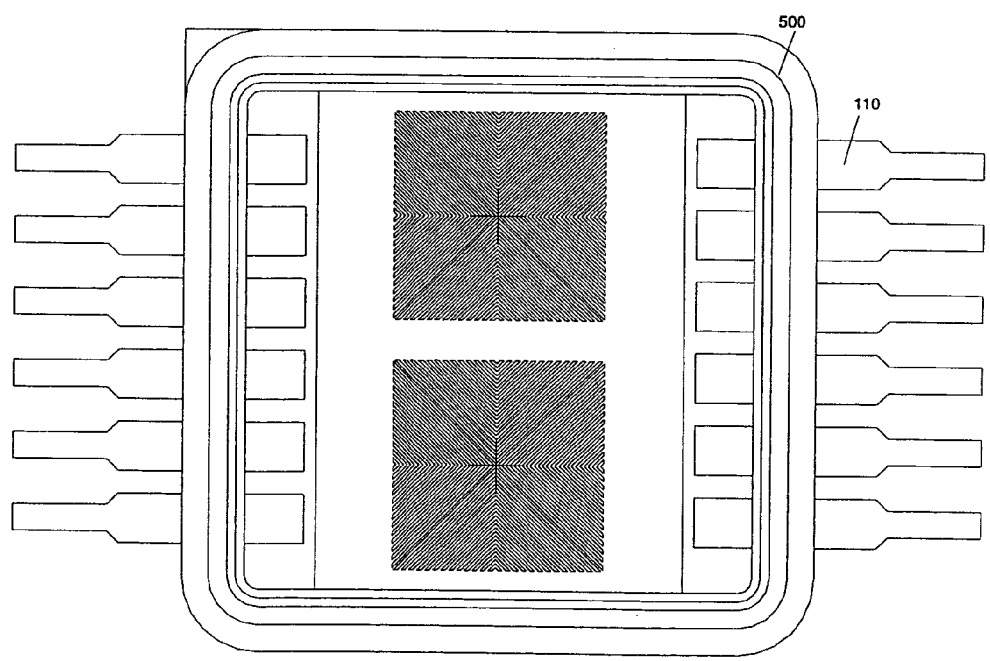

FIG. 5 shows an example of a possible implementation of the bottom structuring in a larger premolded housing 500 having a higher number of leads 110 or terminal pins. It is advantageous here to provide multiple structures as shown in FIG. 5 instead of one overall design for installing multiple chips in a housing 500. The groove structures, i.e., depressions, may have identical or different types of bottom structuring.

In a particularly exemplary embodiment, the "toothing" resulting from the engaging depressions of the component and the housing bottom already provides a certain adhesion which is further reinforced by the bonding material.

What is claimed is:

1. A housing comprising:
   a micromechanical component; and
   a housing portion;
   wherein the component and the housing portion are bonded by a non-detachable bond and the bond is produced by a bonding material between the component and the housing portion,
   wherein at least part of at least one of the component and the housing portion has depressions for receiving the bonding material, and
   wherein the depressions have a symmetric groove structure which is oriented laterally in all directions of the housing portion.

2. The housing according to claim 1, wherein the bonding material is a flexible bonding material.

3. The housing according to claim 1, wherein the depressions are situated on an inner bottom of the housing portion.

4. The housing according to claim 1, wherein the depressions are located on a bottom of the component.

5. The housing according to claim 2, wherein the non-detachable bond by the flexible bonding material between an inner bottom of the housing portion and a bottom of the component in the depressions has high thermal stability.

6. The housing according to claim 1, wherein the bonding material includes a silicone adhesive.

7. The housing according to claim 1, wherein the component and the housing portion have engaging depressions, the engaging depressions being situated on a bottom of the component and on an inner bottom of the housing portion.

8. A method for producing a non-detachable bond between a micromechanical component and a housing, a bonding material being situated between the component and the housing, the method comprising:
   introducing depressions in at least part of at least one of the component and the housing, allowing the bonding material to be and
   producing the depressions as a symmetric groove structure which is oriented laterally in all directions of the housing.

9. The method according to claim 8, wherein the bonding material is a flexible bonding material.

10. The method according to claim 8, wherein the depressions are produced in an inner bottom of the housing, the depressions being produced one of during and after a manufacture of the housing.

11. The method according to claim 8, wherein the depressions are introduced into a bottom of the component.

12. The method according to claim 8, wherein the depressions are produced in the component and on the housing in such a way that they engage with one another.

* * * * *